United States Patent
Kondo

(10) Patent No.: US 11,316,356 B2
(45) Date of Patent: Apr. 26, 2022

(54) METHODS AND APPARATUS FOR A BATTERY

(71) Applicant: SEMICONDUCTOR COMPONENTS INDUSTRIES, LLC, Phoenix, AZ (US)

(72) Inventor: Hideo Kondo, Oizumi-Machi (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 142 days.

(21) Appl. No.: 16/822,492

(22) Filed: Mar. 18, 2020

(65) Prior Publication Data

US 2021/0296916 A1    Sep. 23, 2021

(51) Int. Cl.
*H02J 7/00* (2006.01)
*G01R 31/3835* (2019.01)
*G01R 31/367* (2019.01)

(52) U.S. Cl.
CPC .......... *H02J 7/0047* (2013.01); *G01R 31/367* (2019.01); *G01R 31/3835* (2019.01)

(58) Field of Classification Search
CPC ........ H02J 7/0047; H02J 7/00; G01R 31/367; G01R 31/3835
USPC .......................................... 320/134
See application file for complete search history.

(56) References Cited

U.S. PATENT DOCUMENTS

| | | |
|---|---|---|
| 2004/0196006 A1 | 10/2004 | Kawaguchi |
| 2012/0105014 A1 | 5/2012 | Nakayama |
| 2013/0085696 A1 | 4/2013 | Xu |
| 2016/0327633 A1* | 11/2016 | Kumar Y.B. .............. G01S 7/35 |
| 2017/0077717 A1* | 3/2017 | Lundgren ......... H02J 7/007188 |

* cited by examiner

*Primary Examiner* — Bryce M Aisaka
(74) *Attorney, Agent, or Firm* — Dickinson Wright PLLC

(57) ABSTRACT

Various embodiments of the present technology may provide methods and apparatus for a battery. The apparatus may be configured to autonomously select an appropriate battery profile for a given battery. Autonomous selection may be achieved by measuring the time that the battery voltage is within a specified range and comparing the time results to a reference table having known battery data.

18 Claims, 5 Drawing Sheets

| Voltage range (V) | Profile 1 | Profile 2 | Profile 3 | Profile 4 |
|---|---|---|---|---|
| 2.0-2.39 | — | — | — | 180s |
| 2.4-2.49 | — | — | — | 1380s |
| 2.5-2.59 | — | — | — | 1260s |
| 2.6-2.69 | — | — | — | 420s |
| 2.7-2.79 | — | — | — | 60s |
| 2.8-3.09 | 60s | 120s | — | — |
| 3.1-3.19 | 60s | 120s | — | — |
| 3.2-3.29 | 120s | 780s | — | — |
| 3.3-3.39 | 120s | 2520s | — | — |
| 3.4-3.49 | 180s | 420s | 60s | — |
| 3.5-3.59 | 780s | — | 120s | — |
| 3.6-3.69 | 1260s | — | 420s | — |
| 3.7-3.79 | 780s | — | 120s | — |
| 3.8-3.89 | 120s | — | 120s | — |
| 3.9-4.0 | 120s | — | 120s | — |

FIG.4

METHODS AND APPARATUS FOR A BATTERY

BACKGROUND OF THE TECHNOLOGY

Battery-powered systems typically include a fuel gauge circuit to manage various operations of the battery. In some cases, the fuel gauge circuit is pre-programmed with data that provides operation characteristics of a specific battery. In other cases, the fuel gauge circuit is pre-programmed with unique operation characteristics for a number of different battery types, and once the battery type is selected, the corresponding operation characteristics for that battery is selected. In the case where multiple, unique operation characteristics are provided, the desired operation characteristics must be manually selected for each system based on the selected battery type, which may be costly and time-consuming.

SUMMARY OF THE INVENTION

Various embodiments of the present technology may provide methods and apparatus a battery. The apparatus may be configured to autonomously select an appropriate battery profile for a given battery. Autonomous selection may be achieved by measuring the time that the battery voltage is within a specified voltage range and comparing the time results to a reference table having known battery data.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

FIGS. 3A-3D representatively illustrate battery profiles in accordance with an exemplary embodiment of the present invention; and FIG. 4 illustrates a reference table in accordance with an exemplary embodiment of the present invention.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various voltage sensors, current sensors, coulomb counters, logic gates, timers, memory devices, signal converters, semiconductor devices, such as transistors and capacitors, and the like, which may carry out a variety of functions.

Figure 1:
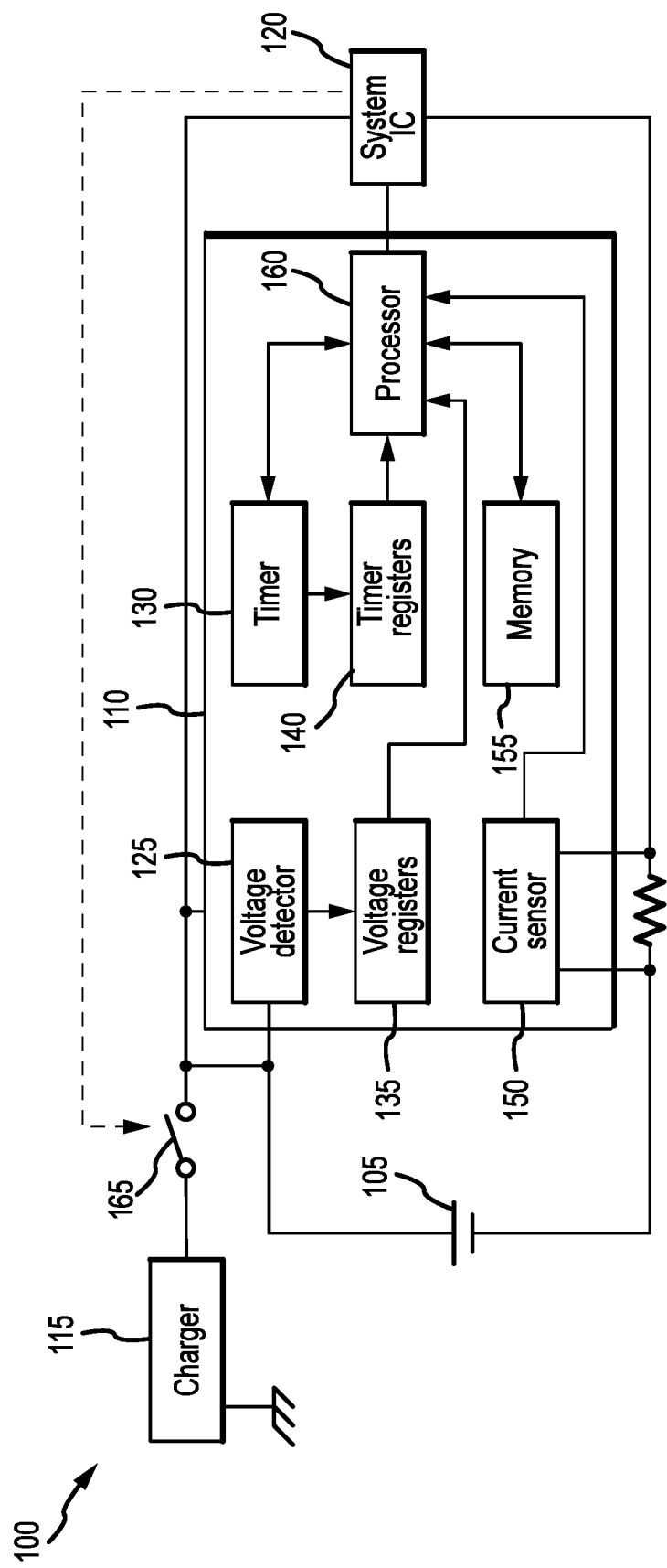
FIG. 1 is a block diagram of a system in accordance with an exemplary embodiment of the present technology.

Methods and apparatus for a battery according to various aspects of the present technology may operate in conjunction with any suitable battery-powered electronic system and/or device, such as "smart devices," wearables, consumer electronics, portable devices, medical devices, and the like. Referring to FIG. 1, an exemplary system 100 may be integrated in an electronic device (not shown), such as an audio headset, powered by a rechargeable battery 105. The system 100 may further comprise a fuel gauge circuit 110, a charger 115, and a system integrated circuit (IC) 120.

The system IC 120 may control charging operations of the battery 105. For example, the system IC 120 may control a switch 165 located between the charger 115 and the battery 105. The system IC 120 may be configured to communicate with the fuel gauge circuit 110 via a communication line. For example, the system IC 120 may provide information to the fuel gauge circuit 110 regarding the charging/discharging state of the battery 105. The system IC 120 may further control various sub-systems and loads (not shown) within the system 100.

The charger 115 may be configured to control charging and discharging of the battery 105. The charger 115 may be connected to battery 105 and may initiate charging and discharging operations at the direction of the system IC 120. The charger 115 may comprise any circuit and/or system suitable for controlling current supplied to the system IC 120 for the purpose of powering the system IC 120 and current supplied to the battery 105 for the purpose of charging the battery 105.

The fuel gauge circuit 110 may be configured to autonomously select an appropriate battery profile, from a plurality of battery profiles, for a given battery type. The fuel gauge circuit 110 may autonomously select the appropriate battery profile for the given battery by measuring the amount of time that the battery voltage is within a number of predetermined voltage ranges and comparing the time results to a reference table having known battery data.

In many applications, the exact battery that will be paired with the fuel gauge circuit 110 is selected according to the particular application or device. For example, the battery type used in a "smart watch" may be different from the battery used in an audio headset, and the chemistry of each battery type differs. Accordingly, each battery type will have its own charging/discharging characteristics, voltage vs. capacity characteristics, and the like. Such characteristics may be referred to collectively as the battery profile, and each battery type will have a corresponding battery profile. In an exemplary embodiment, the fuel gauge circuit 110 may be configured to store a plurality of battery profiles, wherein each battery profile is specific to a particular battery type.

The fuel gauge circuit 110 may comprise a voltage detector 125 to measure a voltage of the battery 105. The voltage detector 125 may be connected to the battery 105 and may comprise any circuit and/or device suitable for measuring a voltage.

The fuel gauge circuit 110 may comprise a current sensor 150 to sense or otherwise measure a current of the battery 105. The current sensor 150 may comprise any circuit and/or device suitable for measuring the current of the battery 105. For example, the current sensor 150 may operate in conjunction with a sense resistor, wherein the current sensor 150 measures the voltage across the sense resistor to determine the current.

The fuel gauge circuit 110 may comprise a timer 130 configured to measure an elapsed time by incrementing in value. Each count may be equivalent to 1 second (s). The timer 130 may comprise any device and/or system suitable for counting and that may be started, stopped, and/or reset at any time.

The fuel gauge circuit 110 may comprise a number of registers to temporarily store data. For example, the fuel gauge circuit 110 may comprise a first set of registers 135 to store one or more measured voltage values (from the voltage detector 125) and a second set of registers 140 to store measured time values (from the timer 130). Each set of registers 140 may comprise any number of registers. In an exemplary embodiment, the number of registers in the second set of registers 140 may be equal or greater than the number of predetermined voltage ranges.

The fuel gauge circuit 110 may further comprise a memory 155 configured to store the plurality of known battery profiles. Each battery profile may indicate a relationship between voltage and capacity based on whether the battery is charging or discharging (e.g., as illustrated in FIGS. 3A-3D). Each battery profile may be stored in a look-up table or other suitable form. In general, during charging, battery capacity is commensurate with time. In other words, if the battery is charging, the battery capacity increases as time elapses, and if the battery is discharging, the battery capacity decreases as time elapses.

The memory 155 may also store the reference table (e.g., as illustrated in FIG. 4), wherein the reference table comprises a number of predetermined voltage ranges, known time values, and battery profile numbers (e.g., profile 1, profile 2, profile 3, profile 4). Each voltage range may be defined by a lower limit value and an upper limit value (i.e., 3.1V-3.19V, where 3.1V is the lower limit value and 3.19 is the upper limit value). The profile numbers correspond to specific battery profiles from the plurality of battery profiles. For example, profile 1 may correspond to the data shown in FIG. 3A, profile 2 may correspond to the data shown in FIG. 3B, profile 3 may correspond to the data shown in FIG. 3C, and profile 4 may correspond to the data shown in FIG. 3D. The reference table may be stored in a look-up table or other suitable form.

The fuel gauge circuit 110 may further comprise a processor 160 configured to receive various battery data, such as the measured battery voltage (from the voltage detector 125 or first set of registers 135) and time values stored in the second set of registers 140. The processor 160 may also receive charge/discharge information from the system IC 120—in other words, the system IC 120 may transmit a signal to the processor 160 indicating whether the battery 105 is charging or discharging. The processor 160 may also be in communication with the memory 155 and may retrieve and/or receive information from a selected battery profile and the reference table. The processor 160 may utilize the information from the first and second set of registers 135, 140 and the reference table to autonomously select the appropriate battery profile from the plurality of battery profiles. For example, the processor 160 may compare the time values received from the second set of registers 140 to the known time values from the reference table and identify the time values from the reference table that best matches (or is closest to) the measured time values. The best matching values correspond to a battery profile number. After the processor 160 identifies the best matching time values, the processor 160 uses the best matching time values to identify the appropriate battery profile number. The processor 160 may then retrieve the data corresponding to the identified battery profile and use the battery profile information to manage various operations of the battery, compute various battery characteristics, such as the relative state of charge, run-time, state of health of the battery, state of charge of the battery, and the like.

In operation, and referring to FIGS. 1-4, the system 100 may be configured to autonomously select a battery profile, from a plurality of battery profiles, for a specified battery. For example, in an exemplary operation, the voltage detector 125 may continuously measure the voltage of the battery 105 and store the measured voltage values in the first set of registers 135. Alternatively, the voltage detector 125 may continuously measure the voltage and transmit the measured voltage directly to the processor 160. The processor 160 may receive a signal from the system IC 120 indicating whether the battery 105 is charging or discharging. If the processor 160 receives a signal indicating that the battery 105 is charging, the processor 160 may identify/detect when the measured voltage reaches a lower limit value of one of the predetermined voltage ranges. For example, when the measured battery voltage is 3.2V, the processor 160 may identify that 3.2V is the lower limit value of the voltage range 3.2-3.29.

The processor 160, upon identifying/detecting that the measured voltage is at the lower limit value of the range, may then initiate the timer 130, such that the timer 130 starts counting. For example, the processor 160 may transmit a control signal (not shown) to the timer 130 that enables (starts), disable (stops), and/or resets the timer 130. Initiating the timer 130 may also comprise resetting the timer 130, if the timer 130 is not already set to zero. The timer 130 may continue to increment in value until the measured voltage reaches the upper limit value for the range. For example, given the range 3.2V-3.29V, the timer 130 will increment in value until the measured voltage reaches 3.29V. The processor 160 may detect that the measured voltage has reached the upper limit value and, in response, stops the timer 130. The count value of the timer 130 may be stored in the second set of registers 140.

The processor 160 may perform the steps described above for each predetermined voltage range until all voltage ranges have been considered. After which, the second set of registers 140 will have stored a plurality of measured time values, where each measured time value corresponds to a single voltage range. For example, the second set of registers 140 may have count values of: T1=120 s stored in a first register (for the range 3.1V-3.19V); T2=780 s stored in a second register (for the range 3.2V-3.29V); T3=2520 s stored in a third register (for the range 3.3V-3.39V); and T4=420 s stored in a fourth register (for the range 3.4V-3.49V). It should be noted that, in some cases, not all registers in the second set of registers 140 will contain a count value because the total range (e.g., 2.0V-4.0V) may be greater than the actual range of the battery 105.

The processor 160 may then receive or otherwise retrieve the recorded time values from the second set of registers 140 and compare the time values to the time values listed in the reference table to determine the set of data that is closest in value to the measured time values. In the present example, the processor 160 may determine that the measured time values are closest in value to the time values listed for profile 2.

Figure 2:
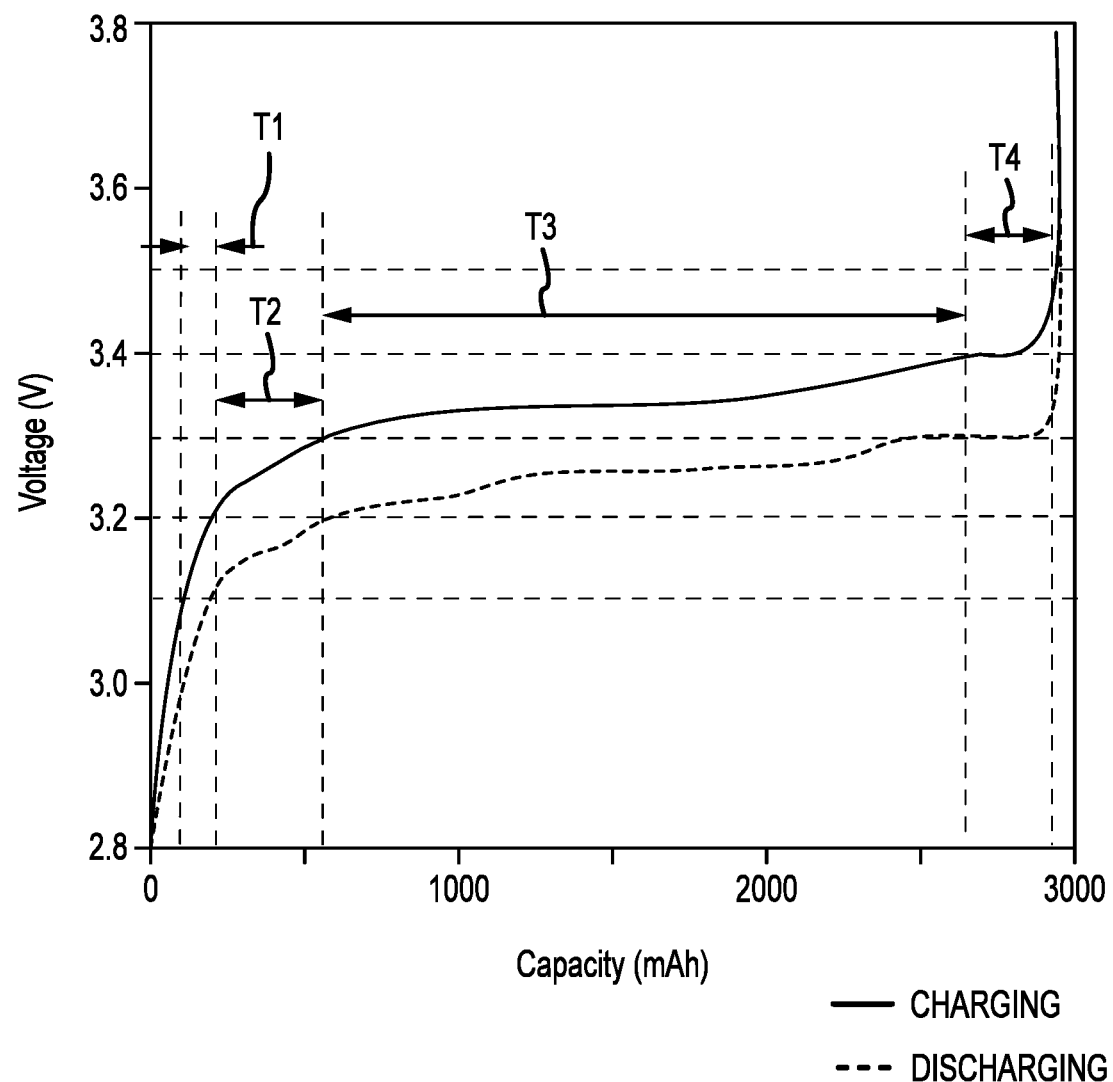
FIG. 2 illustrates measured time at multiple voltage ranges in accordance with an exemplary embodiment of the present invention.
Figure 3A:
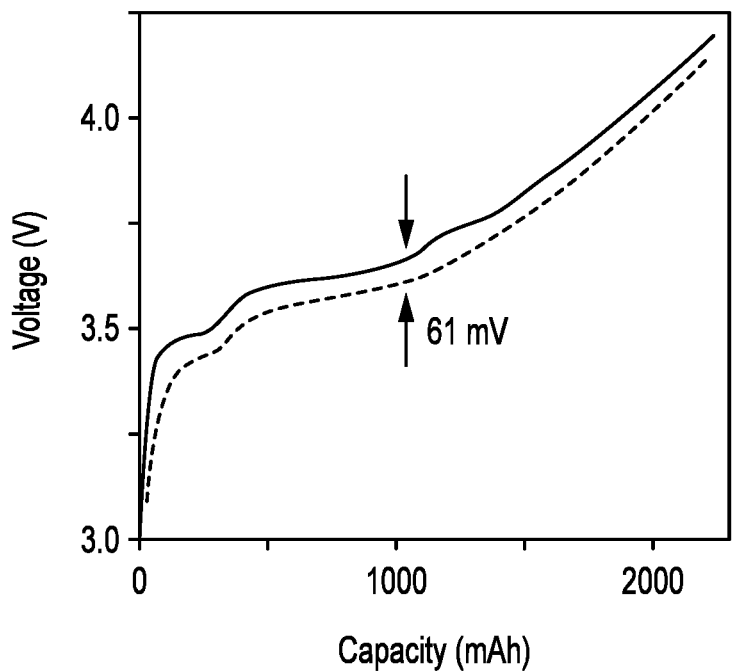
Figure 3B:
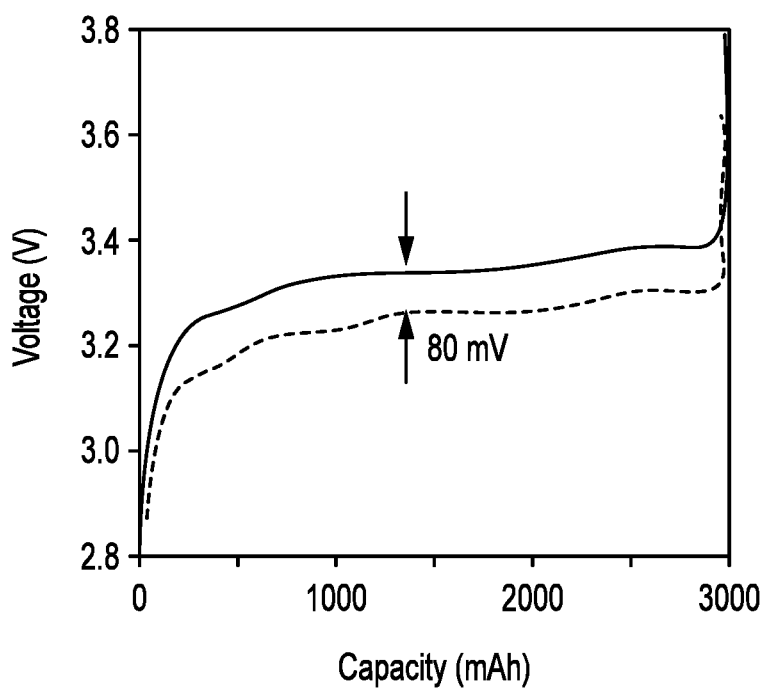
Figure 3C:
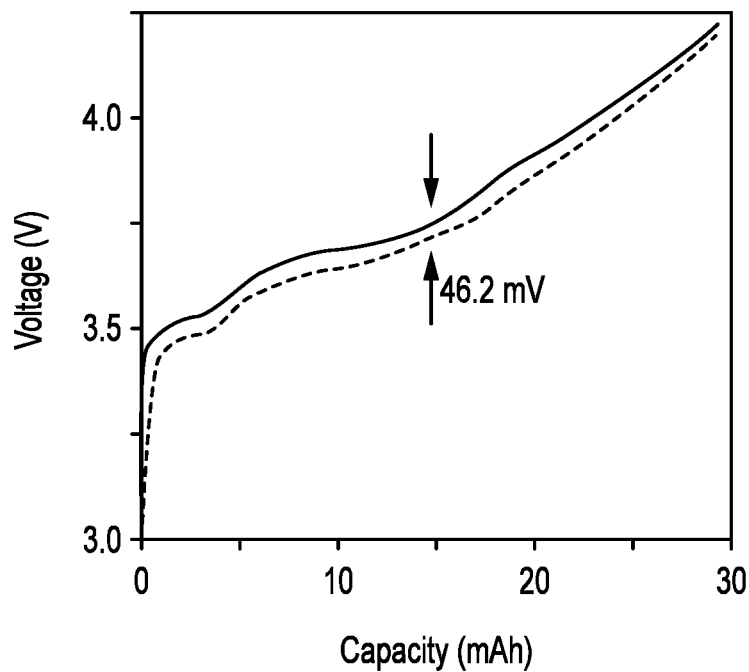
Figure 3D:
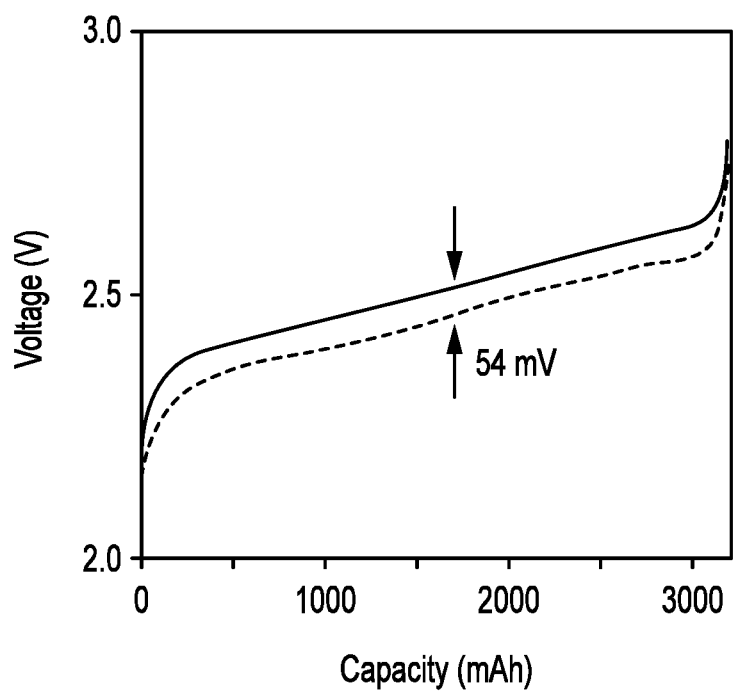

The processor 160 may then retrieve, from the memory 155, the battery characteristic data corresponding to battery profile 2 (in the present example, profile 2 corresponds to the battery characteristic data illustrated in FIGS. 2 and 3B). The processor 160 may utilize the known battery characteristic data from the selected battery profile to compute various battery data, such as the relative state of charge, run-time, state of health of the battery, state of charge of the battery, and the like.

Alternatively, if the processor 160 receives a signal indicating that the battery 105 is discharging, the processor 160 may reset and start the timer 130 when the measured voltage reaches the upper limit value of the predetermined voltage range and stops the timer 130 when the measured voltage reaches the lower limit value of the predetermined voltage range. In an exemplary embodiment, the system IC 120 may indicate a discharging condition if the battery 105 is discharging at a constant current rate.

It should be noted that the lower and upper limits of the predetermined voltage ranges described herein are for illustrative purposes only and may vary based on the number of battery profiles and similarities among the battery profiles, as additional ranges may be needed to distinguish among the profiles as similarities increase.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An apparatus capable of connecting to a battery, comprising:
   a voltage detector configured to measure a voltage of the battery;
   a first register in communication with the voltage detector and configured to store the measured voltage;
   a timer configured to measure a period of time relating to the measured voltage;
   a second register in communication with the timer and configured to store the measured period of time;
   a memory comprising a plurality of battery profiles and a reference table, wherein the reference table comprises voltage values and corresponding time values for each of a plurality of battery profiles relating to battery charging and discharging characteristics; and
   a processor in communication with the first register, the second register, and the memory,
   wherein the processor is configured to:
   compare the measured voltage and the measured period of time with the voltage values and time values from the reference table; and
   select a battery profile from the plurality of battery profiles that corresponds to the measured voltage and measured period of time.

2. The apparatus according to claim 1, wherein each battery profile comprises battery voltage as a function of battery capacity.

3. The apparatus according to claim 1, wherein the processor is further configured to initiate the timer based on the measured voltage.

4. The apparatus according to claim 1, wherein the period of time is defined according to a predetermined voltage range having a lower limit value and an upper limit value.

5. The apparatus according to claim 4, wherein the processor stores the predetermined voltage range and controls operation of the timer in response to the measured voltage.

6. The apparatus according to claim 5 wherein the processor is configured to:
   start the timer when the measured voltage reaches the lower limit value of the predetermined voltage range; and
   stop the timer when the measured voltage reaches the upper limit value of the predetermined voltage range.

7. The apparatus according to claim 5, wherein the processor is configured to:
   start the timer when the measured voltage reaches the upper limit value of the predetermined voltage range; and
   stop the timer when the measured voltage reaches the lower limit value of the predetermined voltage range.

8. A method for autonomously selecting a battery profile for a battery, comprising:
   measuring a voltage of the battery;
   storing the measured voltage;
   measuring a first period of time when the measured voltage falls within a first predetermined voltage range;
   storing the measured first period of time;
   measuring a second period of time when the measured voltage falls within a second predetermined voltage range;

storing the measured second period of time;
utilizing the first and second measured periods of time and a reference table to select a battery profile from a plurality of battery profiles; and
operating the battery according to the selected battery profile,
wherein the plurality of battery profiles relate to battery charging and discharging characteristics, and wherein the reference table comprises voltage values and corresponding time values for each of the plurality of battery profiles relating to the battery charging and discharging characteristics.

9. The method according to claim 8, further comprising receiving a signal indicating whether the battery is charging or discharging, and
if the battery is charging:
starting the timer when the measured voltage reaches a lower limit value of the predetermined voltage range; and
stopping the timer when the measured voltage reaches an upper limit value of the predetermined voltage range; or
if the battery is discharging:
starting the timer when the measured voltage reaches the upper limit value of the predetermined voltage range; and
stopping the timer when the measured voltage reaches the lower limit value of the predetermined voltage range.

10. The method according to claim 8, wherein the reference table comprises voltage values and corresponding time values for each battery profile from the plurality of battery profiles.

11. The method according to claim 8, wherein each battery profile comprises battery voltage as a function of battery capacity.

12. A system, comprising:
a battery; and
a fuel gauge circuit connected to the battery and comprising:
a memory configured to store a plurality of pre-defined battery profiles and a reference table;
a voltage detector configured to measure a voltage of the battery;
a timer configured to:
measure a first period of time when the measured voltage falls within a first predetermined voltage range; and
measure a second period of time when the measured voltage falls within a second predetermined voltage range;
a set of registers configured to store the measured voltage, the measured first period of time, and the measured second period of time; and
a processor configured to:
control the timer based on the measured voltage;
utilize the first and second measured periods of time and the reference table to select a battery profile from the plurality of battery profiles; and
operate the battery according to the selected battery profile,
wherein the plurality of battery profiles relate to battery charging and discharging characteristics, and wherein the reference table comprises voltage values and corresponding time values for each of the plurality of battery profiles relating to the battery charging and discharging characteristics.

13. The system according to claim 12, wherein each battery profile comprises battery voltage as a function of battery capacity.

14. The system according to claim 12, wherein the reference table comprises voltage values and corresponding time values for each battery profile from the plurality of battery profiles.

15. The system according to claim 14, wherein the processor is configured to compare the measured voltage and the measured period of time with the voltage values and time values from the reference table, and select the battery profile that corresponds to the measured voltage and measured period of time.

16. The system according to claim 12, wherein the processor stores the first and second predetermined voltage ranges, and wherein the each predetermined voltage range is defined by a lower limit value and an upper limit value.

17. The system according to claim 16, wherein the processor is further configured to:
reset and start the timer when the measured voltage reaches the lower limit value of the second predetermined voltage range; and
stop the timer when the measured voltage reaches the upper limit value of the second predetermined voltage range.

18. The system according to claim 16, wherein the processor is further configured to:
reset and start the timer when the measured voltage reaches the upper limit value of the second predetermined voltage range; and
stop the timer when the measured voltage reaches the lower limit value of the second predetermined voltage range.

* * * * *